United States Patent
Chang et al.

(10) Patent No.: US 9,716,079 B2
(45) Date of Patent: Jul. 25, 2017

(54) MULTI-CHIP PACKAGE HAVING ENCAPSULATION BODY TO REPLACE SUBSTRATE CORE

(71) Applicant: POWERTECH TECHNOLOGY INC., Hsinchu County (TW)

(72) Inventors: Chia-Wei Chang, Hsinchu County (TW); Kuo-Ting Lin, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 0 days.

(21) Appl. No.: 15/214,465

(22) Filed: Jul. 20, 2016

(65) Prior Publication Data

US 2017/0033084 A1    Feb. 2, 2017

(30) Foreign Application Priority Data

Jul. 29, 2015  (TW) .............................. 104124602 A

(51) Int. Cl.
| | | |
|---|---|---|
| *H01L 23/02* | (2006.01) | |
| *H01L 21/50* | (2006.01) | |
| *H01L 25/065* | (2006.01) | |
| *H01L 23/00* | (2006.01) | |
| *H01L 23/498* | (2006.01) | |
| *H01L 23/31* | (2006.01) | |
| *H01L 25/00* | (2006.01) | |
| *H01L 21/56* | (2006.01) | |
| *H01L 21/78* | (2006.01) | |

(52) U.S. Cl.
CPC .......... *H01L 25/0657* (2013.01); *H01L 21/56* (2013.01); *H01L 21/78* (2013.01); *H01L 23/3128* (2013.01); *H01L 23/49838* (2013.01); *H01L 24/03* (2013.01); *H01L 24/09* (2013.01); *H01L 24/43* (2013.01); *H01L 24/49* (2013.01); *H01L 25/50* (2013.01); *H01L 2224/02331* (2013.01); *H01L 2224/02372* (2013.01); *H01L 2224/04042* (2013.01); *H01L 2224/45144* (2013.01); *H01L 2224/48091* (2013.01); *H01L 2225/06506* (2013.01); *H01L 2225/06562* (2013.01); *H01L 2225/06582* (2013.01); *H01L 2924/181* (2013.01)

(58) Field of Classification Search
CPC . H01L 25/0657; H01L 23/3128; H01L 24/49; H01L 23/49838; H01L 21/56; H01L 24/03; H01L 24/43; H01L 21/78
USPC ........................................... 257/686; 438/109
See application file for complete search history.

(56) References Cited

U.S. PATENT DOCUMENTS

| | | | | |
|---|---|---|---|---|
| 7,960,822 B2 * | 6/2011 | Kim | ................. | H01L 23/49816 257/686 |
| 8,299,626 B2 * | 10/2012 | Mohammed | ............ | H01L 23/13 257/685 |

(Continued)

*Primary Examiner* — Luan C Thai
(74) *Attorney, Agent, or Firm* — Winston Hsu

(57) ABSTRACT

A multi-chip package having no substrate is presented. The multi-chip package includes a chip stacked assembly, a first redistribution layer, a plurality of wire bonds, a plurality of metal pillars, an encapsulation, a second redistribution layer, and a plurality of vertical interposers. The first redistribution layer and the second redistribution layer are used in place of a substrate to reduce the thickness of the multi-chip package. In this way, a package-on-package device formed using the multi-chip package has a reduced thickness.

20 Claims, 7 Drawing Sheets

(56) References Cited

U.S. PATENT DOCUMENTS

| | | | |
|---|---|---|---|
| 8,399,992 B2* | 3/2013 | Park | H01L 23/3128 257/678 |
| 8,623,753 B1* | 1/2014 | Yoshida | H01L 25/105 257/686 |
| 9,224,647 B2* | 12/2015 | Koo | H01L 21/486 |

* cited by examiner

MULTI-CHIP PACKAGE HAVING ENCAPSULATION BODY TO REPLACE SUBSTRATE CORE

CROSS REFERENCE TO RELATED APPLICATION

This application claims the priority benefit of Taiwan application serial no. 104124602, filed on Jul. 29, 2015. The entirety of the above-mentioned patent application is hereby incorporated by reference herein and made a part of this specification.

BACKGROUND OF THE INVENTION

1. Field of the Invention

The present invention relates to a semiconductor package, and more specifically to a multi-chip package having encapsulation body to replace substrate core to be implemented in Package-On-Package (POP) devices.

2. Description of the Prior Art

Ina conventional multi-chip package, a Die-On-Die device, DOD, is a package where a plurality of chips are integrated and stacked in one package to effectively utilize packaging space. A Package-On-Package device, POP, is a package structure that integrates and stacks a plurality of packages. Nowadays, a 32-chips multi-chip package with a final package thickness of 2 mm can be achieved by implementation of DOD along with POP technology. 16 chips are stacked on each other in a single packaging through DOD technology first and then two 16-chip packages are stacked on each other through POP Technology. However, 2 mm final package thickness can no longer meet the requirements of the existing customers. Moreover, the above-mentioned 32-chip multi-chip package may suffer from lower final yield that may lead to higher packaging cost.

SUMMARY OF THE INVENTION

An embodiment of the present invention presents a multi-chip package. The multi-chip package comprises a chip stacked assembly, a first redistribution layer, a plurality of wire bonds, a plurality of metal pillars, an encapsulation, a second redistribution layer, and a plurality of vertical interposers. The chip stacked assembly has a plurality of chips stacked on each other to form a staggered arrangement. An active surface of a top chip of the plurality of chips is exposed by the chip stacked assembly. At least one bonding pad of the plurality of chips is exposed by the chip stacked assembly. The first redistribution layer is formed only on the active surface and is configured to be electrically coupled to the chip stacked assembly. Each of the plurality of wire bonds is formed on a corresponding bonding pad. The plurality of wire bonds is configured to electrically couple the plurality of chips. The plurality of metal pillars are formed on the first redistribution layer and are configured to be electrically coupled to the first redistribution layer. The encapsulation is configured to encapsulate the chip stacked assembly, the plurality of wire bonds and the first redistribution layer. The second redistribution layer is formed on the planar surface and is configured to be electrically coupled to the plurality of metal pillars. The plurality of vertical interposers are disposed in the encapsulation and are configured to electrically couple to the second redistribution layer.

Another embodiment of the present invention presents a method of forming a multi-chip package. The method comprises providing a wafer support system, forming a chip stacked assembly on the wafer support system, forming a first redistribution layer on an active surface of the chip stacked assembly, forming a plurality of wire bonds on the chip stacked assembly, forming metal pillars on the first redistribution layer, forming an encapsulation to encapsulate the chip stacked assembly and the wire bonds, forming a second redistribution layer on the encapsulation, and forming vertical interposers on the encapsulation.

These and other objectives of the present invention will no doubt become obvious to those of ordinary skill in the art after reading the following detailed description of the preferred embodiment that is illustrated in the various figures and drawings.

DETAILED DESCRIPTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, or with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
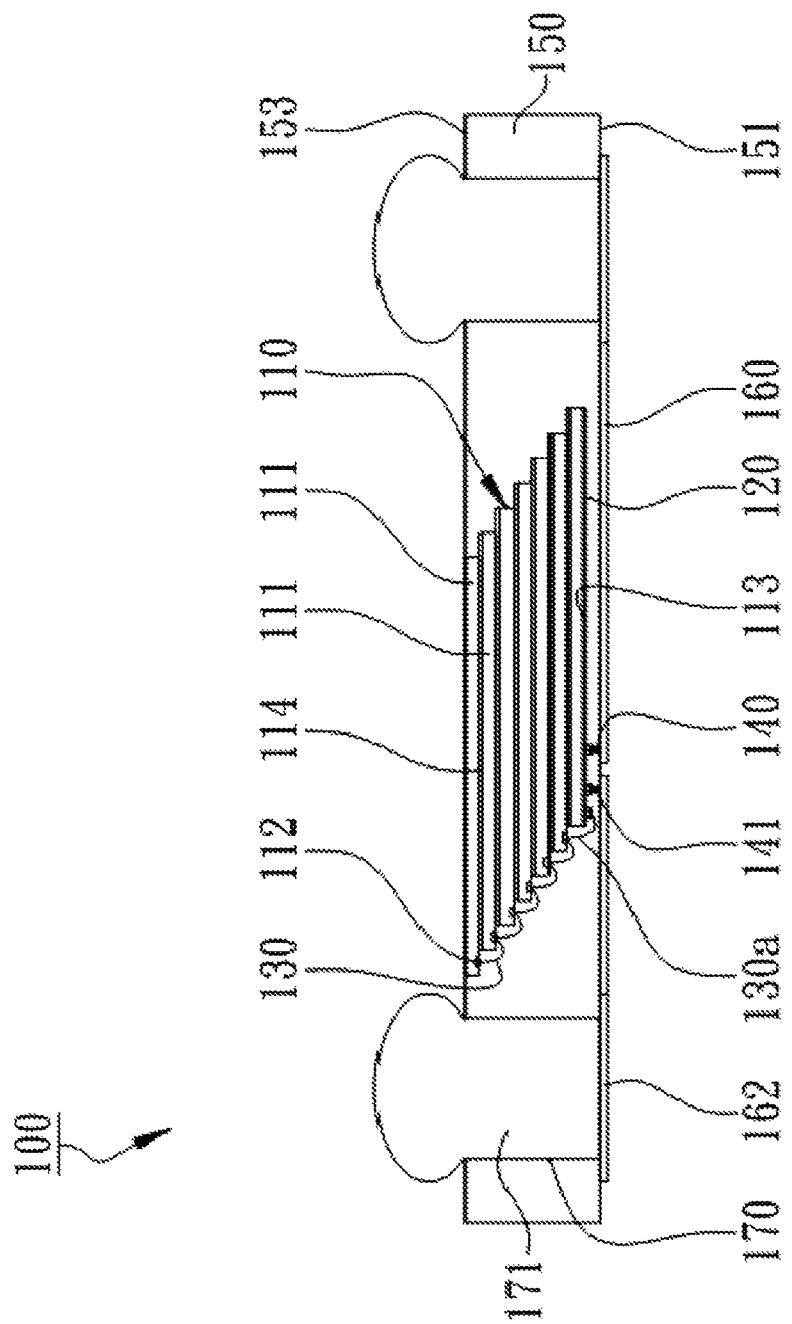
FIG. 1 illustrates a cross sectional view of a multi-chip package 100 according to an embodiment of the present invention.
Figure 2:
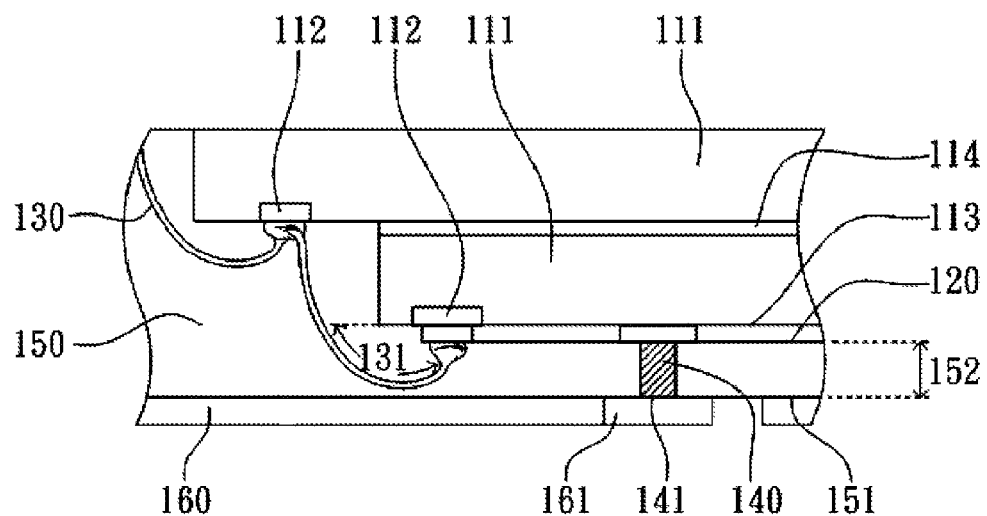
FIG. 2 illustrates a part of the multi-chip package 100 in FIG. 1.
Figure 3:
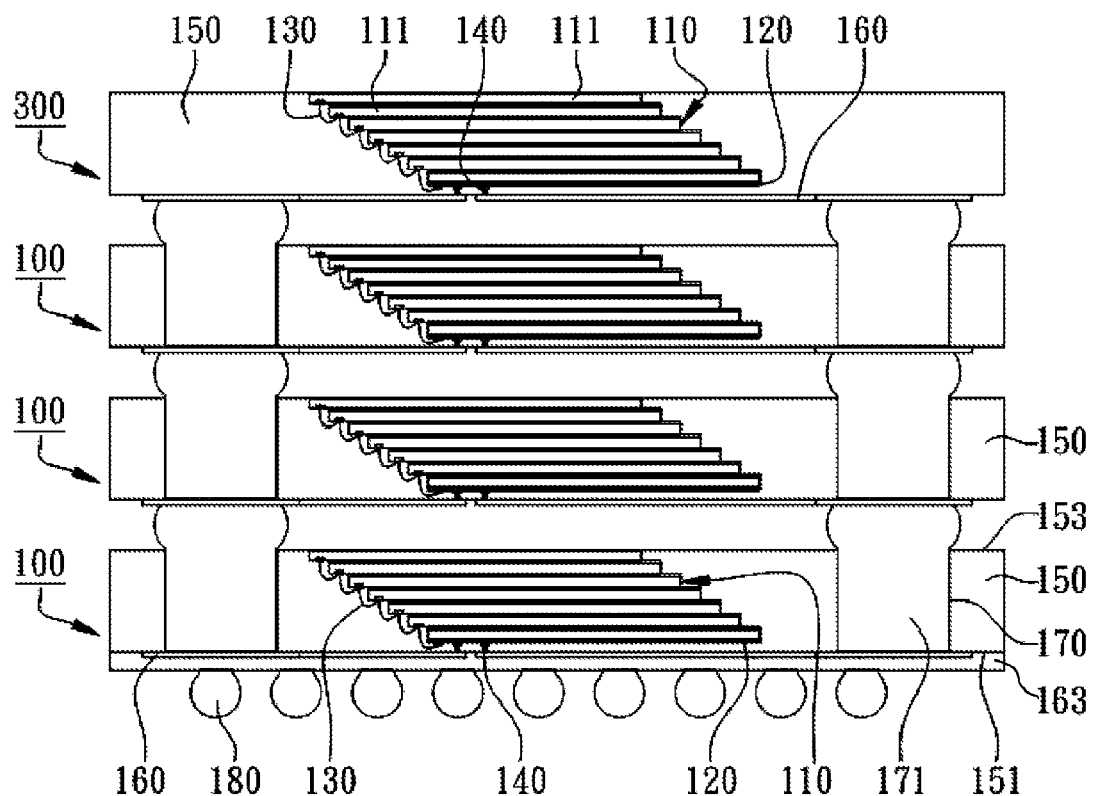
FIG. 3 illustrates a cross sectional view of a package-on-package device formed using the multi-chip package 100 in FIG. 1.
Figure 4A:
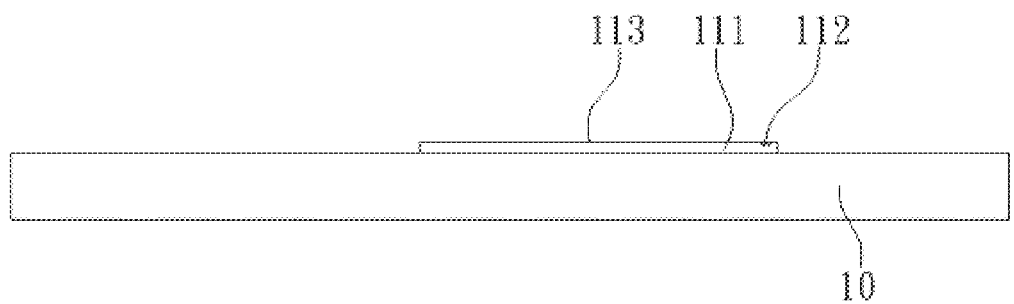
FIG. 4A to FIG. 4J illustrates cross sectional views of the multi-chip package in FIG. 1 during each step of the manufacturing process.
Figure 4B:
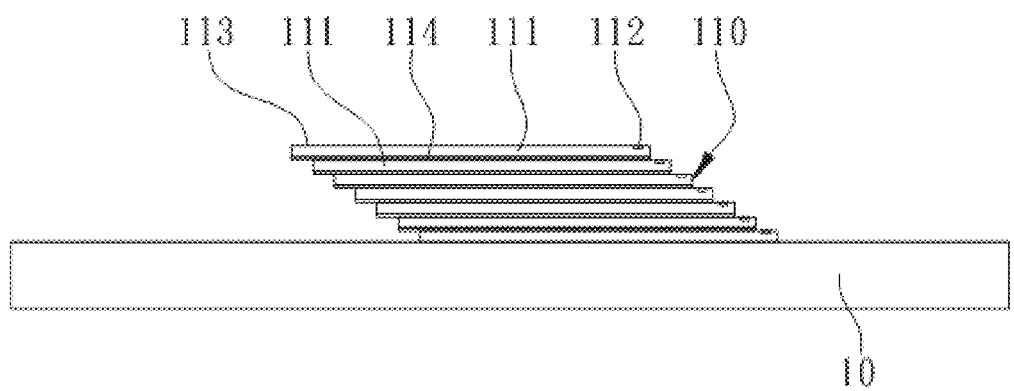
Figure 4C:
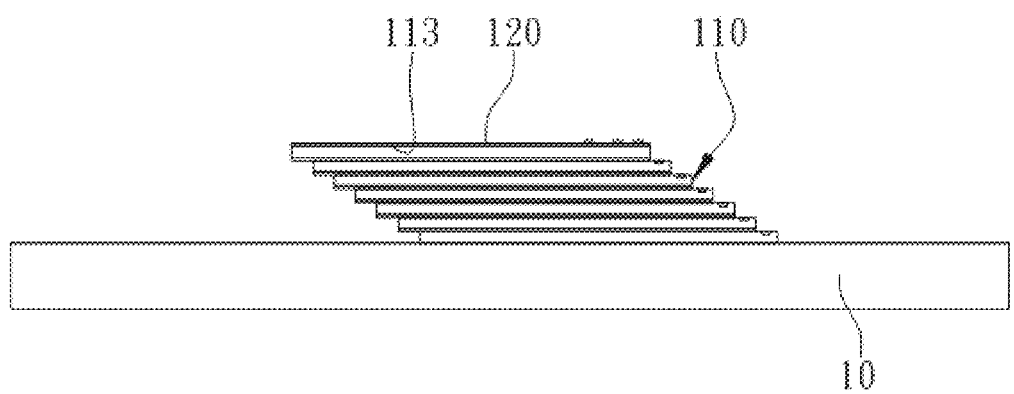
Figure 4D:
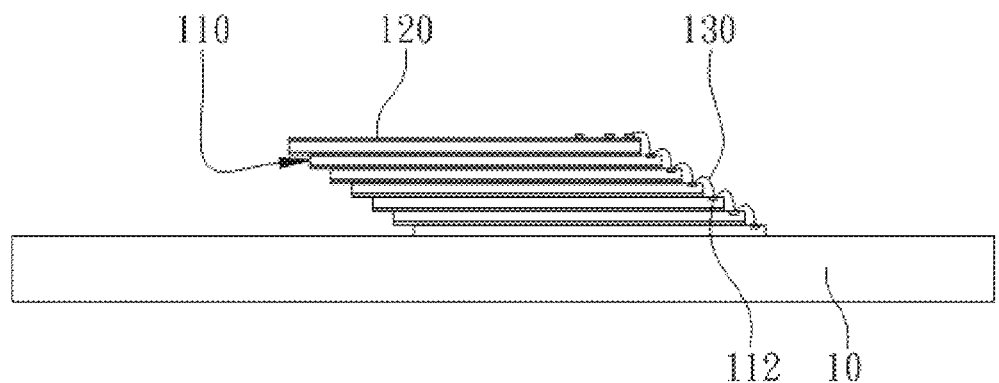
Figure 4E:
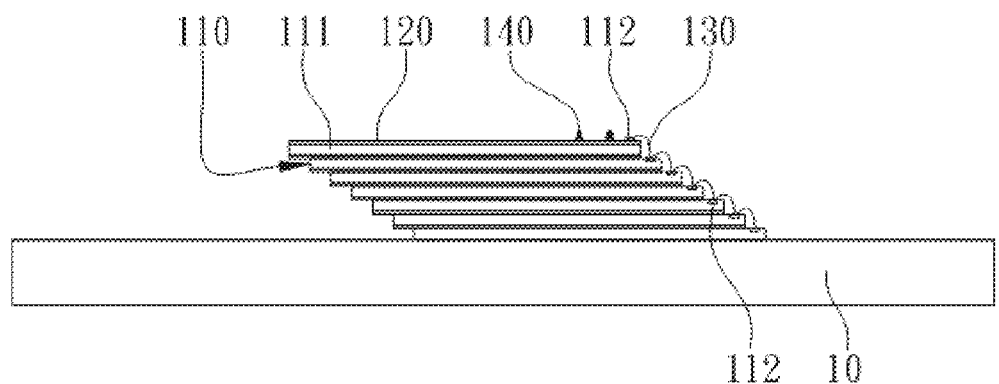
Figure 4F:
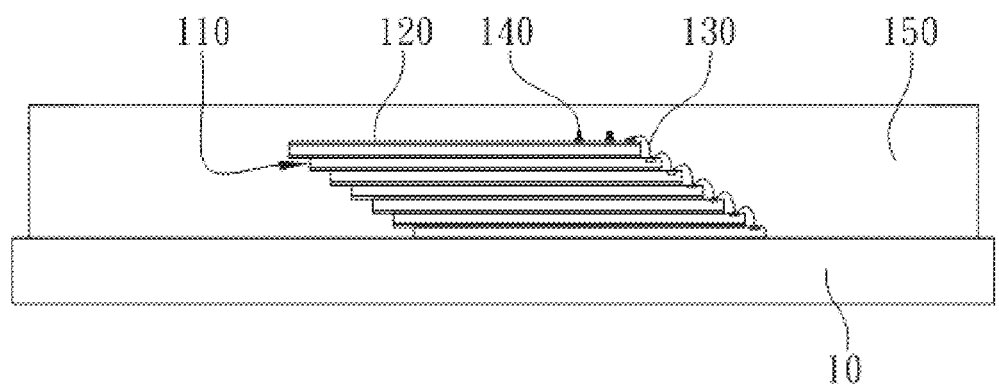
Figure 4G:
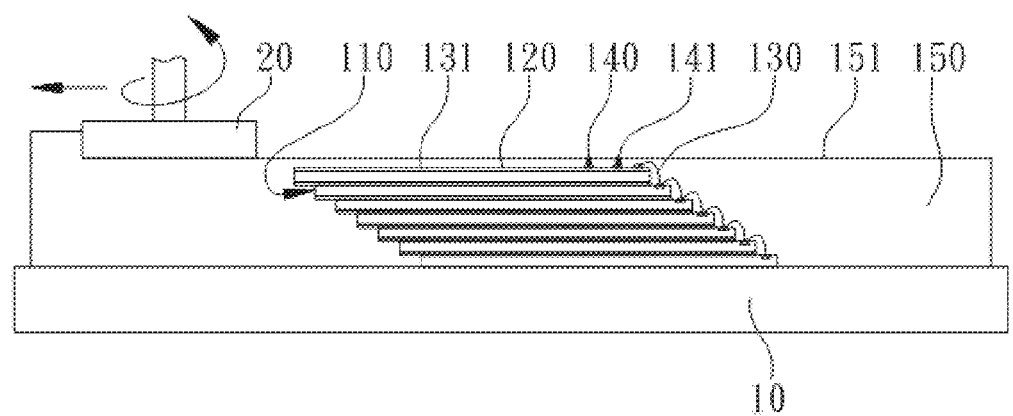
Figure 4H:
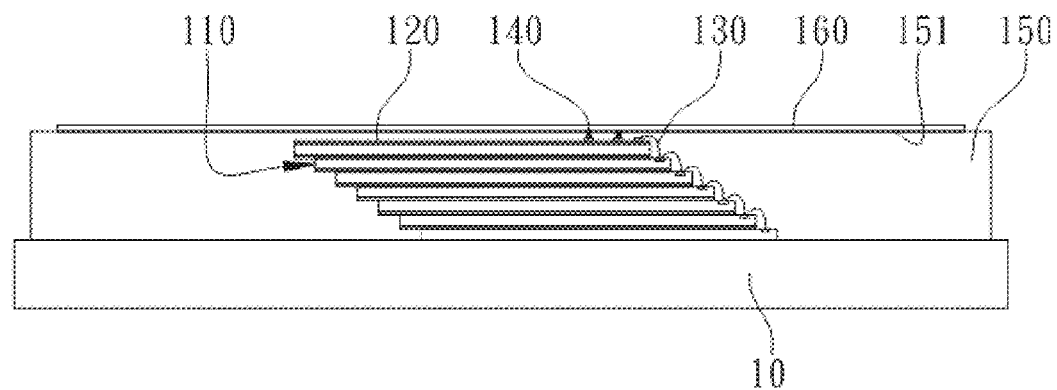
Figure 4I:
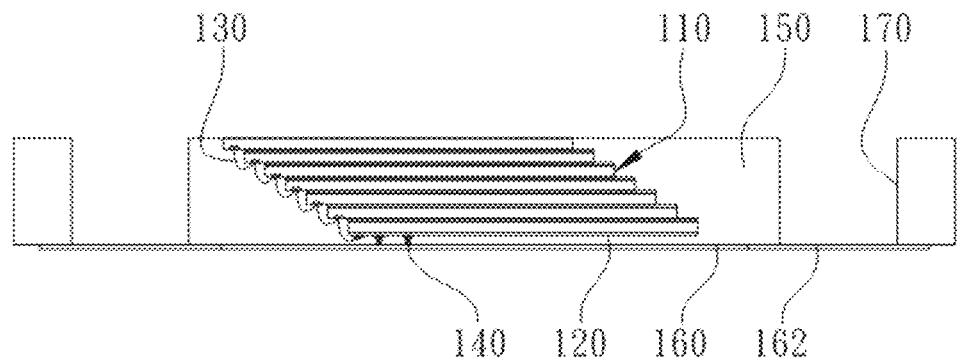
Figure 4J:
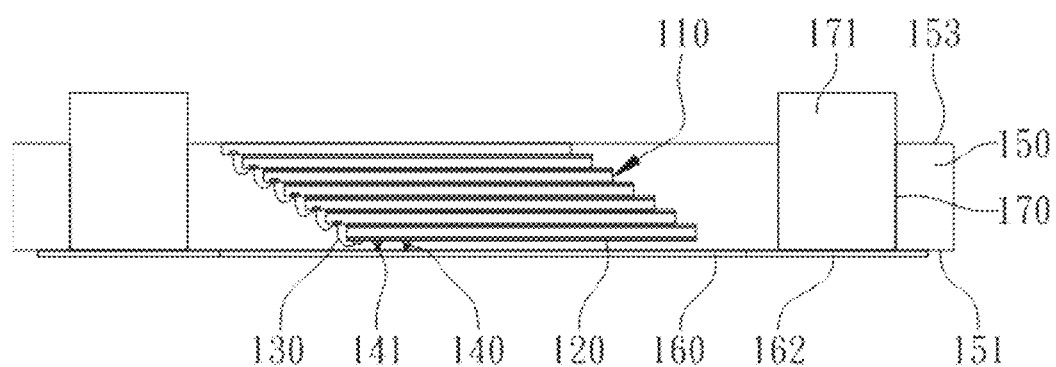

FIG. 1 illustrates a cross sectional view of a multi-chip package 100 according to an embodiment of the present invention. FIG. 2 illustrates a part of the multi-chip package 100 in FIG. 1. FIG. 3 illustrates a cross sectional view of a package-on-package device formed using the multi-chip package 100 in FIG. 1. The multi-chip package 100 comprises a chip stacked assembly 110, a first redistribution layer 120, a plurality of wire bonds 130, a plurality of metal pillars 140, an encapsulation 150, a second redistribution layer 160, and a plurality of vertical interposers. The plurality of vertical interposers may each be formed by filling through holes 170 in the encapsulation 150 with a conductive material 171.

The chip stacked assembly 110 may comprise a plurality of chips 111 stacked on top of each other. Each of the plurality of chips 111 may have at least one bonding pad 112. The at least one bonding pad 112 may be used to electrically couple to the integrated circuit within the chip 111. A top chip 111 of the chip stacked assembly 110 may have an active surface 113 exposed by the chip stacked assembly 110. The said active surface 113 may also serve as the active surface of the chip stacked assembly 110. An adhesive layer 114 may be used to adhere the chips 111 of the chip stacked assembly 110 to each other. The active surface 113 may be facing the second redistribution layer 160. The plurality of chips 111 may be stacked on each other in a staggered arrangement to expose the bonding pads 112 of the plurality of chips 111. The wire bonds 130 may be used to correspondingly couple the bonding pads 112 to form electrical connection between the plurality of chips 111.

The first redistribution layer 120 may be formed on the active surface 113 of the chip stacked assembly 110. Semiconductor process such as lithography, electroplating, etching, or deposition may be used to form a redistribution layer. Since the multi-chip package 100 uses redistribution layers, there is no need to use substrates. As compared to using printed circuit boards as substrates, the redistribution layer offers a better thickness and size than the printed circuit board. The first redistribution layer 120 may be formed using copper, aluminum, gold, platinum, nickel, tin, or a combination thereof. The first redistribution layer 120 may also be formed using conductive polymers, conductive ceramics (i.e. indium tin oxide or indium zinc oxide) or other conductive material. The first redistribution layer 120 may be formed only on the active surface 113.

As shown in FIG. 1 and FIG. 2, the plurality of wire bonds 130 may be used to electrically couple the bonding pads 112 of the chips to each other. The wire bonds 130 may be formed using the wire bonding process. As shown in FIG. 2, each of the bond wires 113 may have a wire loop section 131 that extends away from the active surface 113. The wire loop section 131 of the wire bond 130 may extend away from the active surface 113 towards another chip 111 of the chip stacked assembly 110. The wire bonds 130 may be formed to be at a distance from the edge of the chip 111 to prevent damages. In some other embodiments, through silicon vias or die sidewall circuitry may be used to electrically couple the plurality of chips 111 to each other.

The plurality of metal pillars 140 may be disposed on the first redistribution layer 120. The plurality of metal pillars 140 may each have a top surface 141. Furthermore, the height of the metal pillars 140 may be greater than the height of the wire loop section 131. The height of the metal pillars 140 may range from 25 um to 200 um. The metal pillars 140 may be electrically coupled to fan in bumps 161 of the second redistribution layer 160.

The encapsulation 150 may be used to encapsulate chip stacked package 110 and the plurality of wire bonds 130. The encapsulation 150 may be formed using a thermally setting material such as epoxy molding compound. The encapsulation 150 may have a planar surface 151. The planar surface 151 may be disposed above the active surface 113 and adjacent to the first redistribution layer 120. The encapsulation 150 may cover the first redistribution layer 120 by a thickness 152 to encapsulate the wire loop section 131 and the metal pillars 140. However, the top surface 141 of the metal pillars 140 are exposed through the planar surface 151 to allow the metal pillars 140 to couple with the second redistribution layer 160. The height of the wire loop section 131 may be less than the height of the thickness 152. In this way, the wire bonds 130 may not be exposed on the planar surface 151.

The second redistribution layer 160 may be formed on the planar surface 151 of the encapsulation 150. The second redistribution layer 160 may extend to the periphery of the planar surface 151 to form a fan-out circuit. The second redistribution layer 160 may be electrically coupled to the first redistribution layer 120 through the metal pillars 140. The top surface 141 of the metal pillars 140 may be formed to be coplanar to the planar surface 151 through grinding process. In this way, the second redistribution layer 160 may be formed on the planar surface 151 and the electrical coupling of the second redistribution layer 160 to the metal pillars 140 may be enhanced.

The vertical interposers may be disposed on the peripheral region of the encapsulation 150. The vertical interposers may electrically couple the second redistribution layer 160 to the package bonding surface 153 of the encapsulation, the package bonding surface 153 being formed opposite to the planar surface 151. The vertical interposers may be formed by forming through holes 170 on the encapsulation 150 and filling the through holes 170 with conductive material 171. In this way, the vertical interposers may be electrically couple the fan-out pads 162 of the second redistribution layer 160 to the package bonding surface 153. In this way, the thickness of the multi-chip package 100 may be reduced by the thickness of a substrate. The multi-chip package 100 may then be used to form a package-on-package device. The conductive material 171 may be a soldering material or other conductive materials such as copper, aluminum, copper-aluminum alloy, or copper alloy. In some other embodiments, vertical interposers may be attach metal pillar or other known type of vertical interposers such as vertical wires. The vertical interposers formed in the through holes 170 of the encapsulation 150 may be used as coupling terminals for forming package-on-package devices. Thus, the use of through holes 170 and conductive material 171 to form the vertical interposers may be advantageous.

The thickness of the encapsulation 150 may be less than a thickness of a substrate (approximately 500 um). The thickness 152 of the encapsulation 150 from the active surface 113 may range between 25 um to 200 um. Thus, the use of substrateless multi-chip package 100 to form package-on-package device may greatly reduce the thickness. The conductive material 171 maybe protruding from the package bonding surface 153 of the encapsulation 150. And, the protruding part of the conductive material 171 may form solder balls after going through a reflow process. By applying reflow process to the conductive material 171, a plurality of chip stacked assembly may be electrically coupled to each other to form a package-on-package device.

As shown in FIG.3, the conductive material 171 may be used to achieve package stacking and electrical coupling between packages. A plurality of multi-chip packages may be stacked to each other to form the package-on-package device. The multi-chip package 300 at the top of the package-on-package device may be similar in structure to the multi-chip package 100 with the exception of not having vertical interposers. Furthermore, the multi-chip package 100 at the bottom of the package-on-package device may further comprise a plurality of solder balls 180 disposed on the second redistribution layer 160 and configured to form the connection terminal for the package-on-package device. In some embodiments, a solder mask 163 may be formed on the second redistribution layer 160 to increase protection and isolation.

Figure 5:
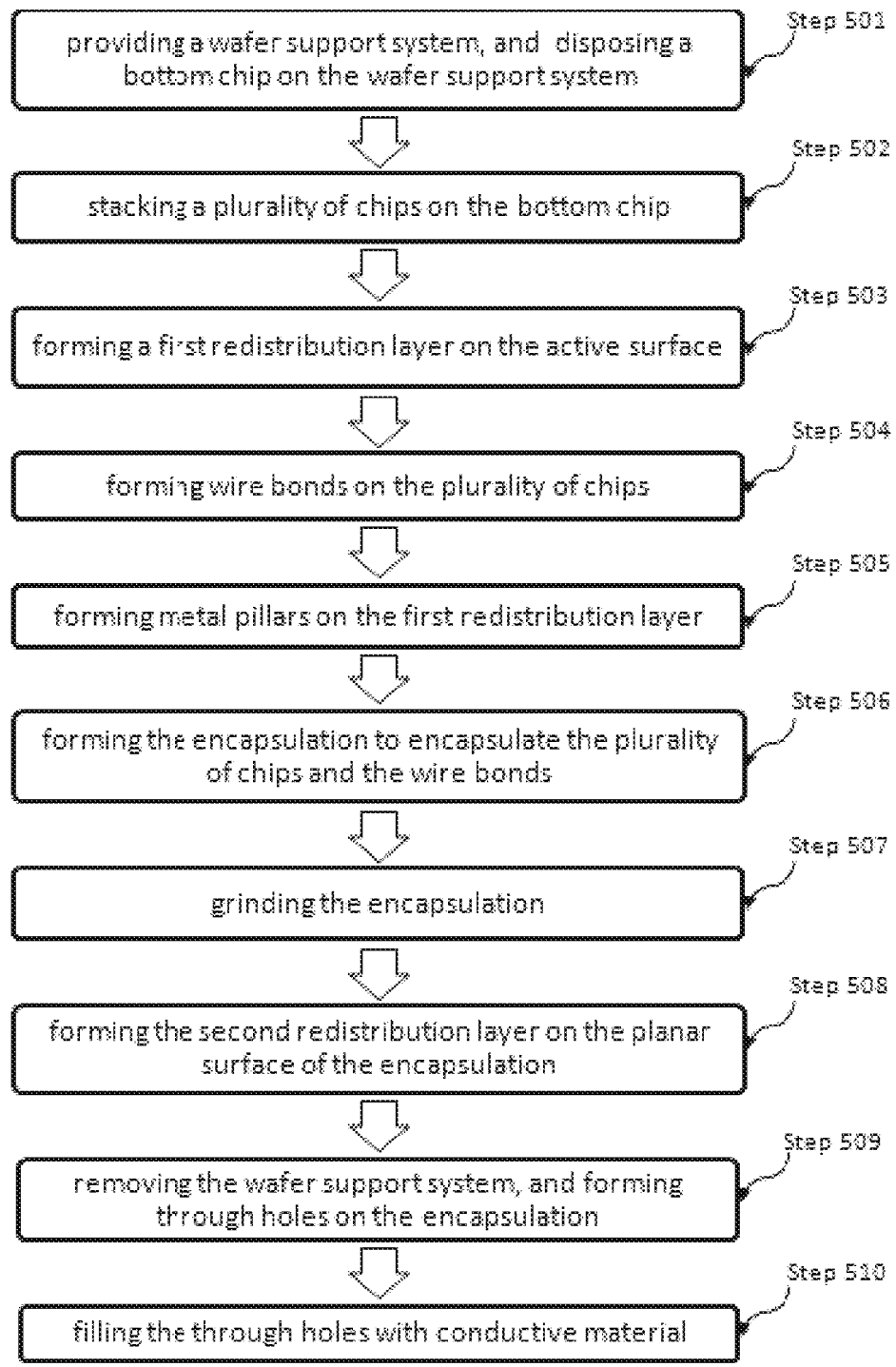
FIG. 5 illustrates a flowchart of the manufacturing process of the multi-chip package in FIG. 1.

FIG. 4A to 4J illustrates cross sectional views of the multi-chip package 100 during each step of the manufacturing process. FIG. 5 illustrates a flowchart of the manufacturing process of the multi-chip package 100 in FIG. 1. The manufacturing process may include, but is not limited to, the following steps:

Step 501: providing a wafer support system 10; disposing a bottom chip 111 on the wafer support system 10;

Step 502: stacking a plurality of chips 111 on the bottom chip 111;
Step 503: forming a first redistribution layer 120 on the active surface 113;
Step 504: forming wire bonds 130 on the plurality of chips 111;
Step 505: forming metal pillars 140 on the first redistribution layer 120;
Step 506: forming the encapsulation 150 to encapsulate the plurality of chips 111 and the wire bonds 130;
Step 507: grinding the encapsulation 150;
Step 508: forming the second redistribution layer 160 on the planar surface 151 of the encapsulation 150;
Step 509: removing the wafer support system 10; forming through holes 170 on the encapsulation 150; and
Step 510: filling the through holes 170 with conductive material 171.

In step 501, a wafer support system 10 may be provided. The wafer support system 10 may be a glass wafer having adhesive property. In this way, the bottom chip 111 may be disposed on the wafer support system 10. In step 502, a plurality of chips may be stacked on the bottom chip 111 to form a chip stacked assembly 110. The plurality of chips 111 may use die attach film 114 to adhere to each other. The die attach film 114 may be formed using die attach materials to avoid contaminating the bonding pads 112. The top chip 111 of the chip stacked assembly 110 may have an active surface 113 exposed in the chip stacked assembly 110. The plurality of chips may be stacked on each other in a staggered arrangement. The bonding pads 112 of each of the plurality of the chips 111 may be exposed in the chip stacked assembly 110.

In step 503, semiconductor fabrication process may be used to form the first redistribution layer 120 on the active surface 113 of the chip stacked assembly. In step 504, wire bonds 130 are formed to electrically couple the plurality of chips 111 to each other. The wire bonds 130 may electrically couple the bonding pads 112 of the chips 111. The wire bonds 130 may be formed using wire bonding process.

In step 505, the metal pillars 140 are formed on the redistribution layer 120. The metal pillars 140 may be formed before or after forming the wire bonds 130. When the metal pillars are formed after forming the wire bonds 130, the metal pillars 140 may be prevented from affecting the forming of the wire bonds 130. When the metal pillars are formed before forming the wire bonds 130, the metal pillars 140 may be formed using electroplating process. The metal pillars 140 may be copper pillar bumps. The wire bonds 130 may be gold wires. The hardness of the metal pillars 140 may be greater than the hardness of the wire bonds 130. In this way, deformation of the metal pillars 140 during encapsulation process may be prevented. And, the wire bonds 130 may not be exposed through the planar surface 151 of the encapsulation 150.

In step 506, an encapsulation 150 may be formed to encapsulate the chip stacked assembly 110 and the wire bonds 130. The encapsulation 150 may be formed through transfer molding, compression molding, or other coating method such as spin coating, printing, or spraying.

In step 507, a grinder 20 may be used to ground the encapsulation 150 to form a planar surface 150. The planar surface 151 may be disposed on the active surface 113 and adjacent to the first redistribution layer 120. The top surface 141 of the metal pillars 140 may be exposed through the planar surface 151.

In step 508, the second redistribution layer 160 may be formed on the planar surface 151 of the encapsulation 150. The second redistribution layer may expand towards the periphery of the planar surface 151 to form a fan-out circuit. The second redistribution layer 160 may be electrically coupled to the first redistribution layer 120 through the metal pillars 140. The second redistribution layer 160 may be used to adjust the circuit density. The circuit density of the metal pillars 140 may be redistributed to enhance the yield for forming the vertical interposers.

In step 509, the wafer support system 10 may be removed. Furthermore, vertical interposers may be formed to electrically couple the second redistribution layer to the package bonding surface 153 of the encapsulation 150. The package bonding surface 153 may be opposite to the planar surface 151. Also, in step 509, a plurality of through holes 170 may be formed on the peripheral region of the encapsulation 150. In step 510, the through holes 170 may be filled with conductive material 171 through electroplating, screen printing, or stencil printing. Thus, the vertical interposers may be electrically coupled to the second redistribution layer 160. The second redistribution layer 160 may have a plurality of fan out pads 162 each aligned to a corresponding through hole 170. The conductive material 171 may be electrically coupled to the fan out pads 162. The conductive material may be protruding from the package bonding surface 153. The second redistribution layer 160 is used to couple the fan in pads 161 coupled to the metal pillars 140 to the fan out pads 162. In this way, the second redistribution layer 160 may be used to adjust the circuit density. The high circuit density of the metal pillars 140 maybe redistributed to increase fabrication yield. Reflow process may then be applied to the protruding part of the conductive material 171 to form solder balls. Singulation process may be performed to form the multi-chip package 100 shown in FIG. 1.

The present invention presents a multi-chip package having no substrate. In this way, the thickness of the conventional multi-chip package may be reduced by the thickness of the substrate. The multi-chip package presented is ideally used to form package-on-package device.

The above description of embodiments of this invention is intended to be illustrative but not limiting. Other embodiments of this invention will be obvious to those skilled in the art in view of the above disclosure which will still be covered by and will be within the scope of the present invention even with any modifications, equivalent variations, and adaptations.

What is claimed is:
1. A multi-chip package comprising:
  a chip stacked assembly, the chip stacked assembly having a plurality of chips stacked on each other to form a staggered arrangement, an active surface of a top chip of the plurality of chips being exposed by the chip stacked assembly, at least one bonding pad of the plurality of chips being exposed by the chip stacked assembly;
  a first redistribution layer formed only on the active surface and configured to be electrically coupled to the chip stacked assembly;
  a plurality of wire bonds, each of the plurality of wire bonds formed on a corresponding bonding pad, the plurality of wire bonds configured to electrically couple the plurality of chips;
  a plurality of metal pillars formed on the first redistribution layer and configured to electrically couple to the first redistribution layer;
  an encapsulation configured to encapsulate the chip stacked assembly, the plurality of wire bonds and the first redistribution layer, the encapsulation having a planar surface and a package bonding surface opposite to the planar surface;

a second redistribution layer formed on the planar surface, and configured to electrically couple to the plurality of metal pillars; and a plurality of vertical interposers disposed in the encapsulation and configured to provide for package stacking, to provide electrical coupling between packages, and to electrically couple the second redistribution layer to the package bonding surface.

2. The multi-chip package of claim 1, wherein the chip stacked assembly further having at least one die attach film disposed between two chips of the chip stacked assembly and configured to adhere the two chips to each other.

3. The multi-chip package of claim 1, wherein a height of a metal pillar is greater than a height of a wire loop section of a wire bond formed on the active surface of the top chip.

4. The multi-chip package of claim 1, wherein the plurality of vertical interposers are formed by filling a conductive material in through holes of the encapsulation; wherein a part of the conductive material is protruding from the package bonding surface of the encapsulation.

5. The multi-chip package of claim 4, wherein the part of the conductive material protruding from the package bonding surface is configured to form solder balls after reflow process.

6. The multi-chip package of claim 1, wherein a top surface of each of the metal pillars are coplanar to the planar surface of the encapsulation after performing grinding process on the encapsulation.

7. The multi-chip package of claim 1, further comprising a plurality of solder balls disposed on the second redistribution layer and configured to form connection terminals for the multi-chip package.

8. The multi-chip package of claim 1, further comprising a solder mask formed on the second redistribution layer and configured to increase protection and isolation of the multi-chip package.

9. A method of forming a multi-chip package, comprising:
providing a wafer support system;
forming a chip stacked assembly on the wafer support system;
forming a first redistribution layer only on an active surface of the chip stacked assembly;
forming a plurality of wire bonds on the chip stacked assembly;
forming metal pillars on the first redistribution layer;
forming an encapsulation to encapsulate the chip stacked assembly, the wire bonds, and the first redistribution layer; wherein the encapsulation has a planar surface and a package bonding surface opposite to the planar surface
forming a second redistribution layer on the planar surface of the encapsulation; and
forming vertical interposers on the encapsulation, the vertical interposers configured to provide for package stacking, to provide electrical coupling between packages, and to electrically couple to the second redistribution layer to the package bonding surface.

10. The method of claim 9, further comprising:
removing the wafer support system after forming the second redistribution layer on the encapsulation.

11. The method of claim 9, further comprising:
performing a singulation process to form a single multi-chip package.

12. The method of claim 9, wherein forming the chip stacked assembly on the wafer support system comprises:
disposing a bottom chip on the wafer support system; and
stacking a plurality of chips on the bottom chip;
wherein the plurality of chips and the bottom chip is stacked on each other in a staggered arrangement;
wherein the active surface of the chip stacked assembly is an active surface of a top chip of the chip stacked assembly.

13. The method of claim 12, wherein at least one die attach film are used to adhere chips of the chip stacked assembly to each other.

14. The method of claim 13, wherein each of the plurality of wire bonds are formed on a corresponding bonding pad of a chip of the chip stacked assembly and are configured to electrically couple chips of the chip stacked assembly.

15. The method of claim 9, wherein a height of a metal pillar is greater than a height of a wire loop section of a wire bond formed on the active surface of the top chip.

16. The method of claim 9, further comprising:
grinding the encapsulation to expose top surfaces of the metal pillars on the planar surface of the encapsulation.

17. The method of claim 9, wherein forming the vertical interposers on the encapsulation comprises:
forming through holes on a peripheral region of the encapsulation; and
filling the through holes with a conductive material;
wherein a part of the conductive material is protruding from the package bonding surface of the encapsulation.

18. The method of claim 17, further comprising:
performing a reflow process on the vertical interposers to form the conductive material protruding from the package bonding surface of the encapsulation into solder balls.

19. The method of claim 9, further comprising:
forming a solder mask on the second redistribution layer to increase protection and isolation of the multi-chip package.

20. The method of claim 9, further comprising:
disposing a plurality of solder balls on the second redistribution layer to form connection terminals for the multi-chip package.

* * * * *